(12) United States Patent
Annese et al.

(10) Patent No.: US 7,572,703 B2
(45) Date of Patent: Aug. 11, 2009

(54) METHOD FOR MANUFACTURING A VERTICAL-GATE MOS TRANSISTOR WITH COUNTERSUNK TRENCH-GATE

(75) Inventors: Marco Annese, Vignate (IT); Pietro Montanini, Milan (IT); Riccardo Depetro, Domodossola (IT)

(73) Assignee: STMicroelectronics S.r.l., Agrate Brianza (IT)

(*) Notice: Subject to any disclaimer, the term of this patent is extended or adjusted under 35 U.S.C. 154(b) by 338 days.

(21) Appl. No.: 11/558,283

(22) Filed: Nov. 9, 2006

(65) Prior Publication Data
US 2007/0141787 A1 Jun. 21, 2007

(30) Foreign Application Priority Data
Nov. 10, 2005 (IT) ............ MI2005A2140

(51) Int. Cl.
*H01L 21/336* (2006.01)
(52) U.S. Cl. ........... 438/270; 438/589; 257/E21.419
(58) Field of Classification Search ............. 438/270, 438/271, 589; 257/330, E21.419, E21.429
See application file for complete search history.

(56) References Cited
U.S. PATENT DOCUMENTS

| 4,455,740 | A |  | 6/1984 | Iwai ..................... 29/571 |
|---|---|---|---|---|
| 4,914,058 | A | * | 4/1990 | Blanchard ............... 438/270 |
| 5,124,764 | A |  | 6/1992 | Mori .................... 357/23.4 |
| 5,371,024 | A | * | 12/1994 | Hieda et al. ............. 438/291 |
| 6,586,800 | B2 |  | 7/2003 | Brown .................... 257/330 |
| 2002/0153558 | A1 | * | 10/2002 | Takemori et al. ......... 257/330 |
| 2005/0014337 | A1 | * | 1/2005 | Hadizad ................. 438/268 |

* cited by examiner

*Primary Examiner*—Trung Dang
(74) *Attorney, Agent, or Firm*—Lisa K. Jorgenson; Robert Iannucci; Seed IP Law Group PLLC

(57) ABSTRACT

A method manufactures a vertical-gate MOS transistor integrated in a semiconductor chip having a main surface. The method includes: forming a trench gate extending into the chip from the main surface to a gate depth, by forming a control gate and an insulation layer for insulating the control gate from the chip. Forming the trench gate includes: forming a trench extending into the chip from the main surface to a protection depth less than the gate depth, the trench having a lateral wall and a bottom wall with an edge portion of the lateral wall extending from the main surface being inclined outwardly with respect to the remaining portion of the lateral wall; forming a first auxiliary insulation layer in the trench; removing a bottom wall of the first auxiliary insulation layer; extending the trench to the gate depth; and forming a second auxiliary insulation layer in the trench.

35 Claims, 8 Drawing Sheets

METHOD FOR MANUFACTURING A VERTICAL-GATE MOS TRANSISTOR WITH COUNTERSUNK TRENCH-GATE

BACKGROUND OF THE INVENTION

1. Field of the Invention

The present invention generally relates to semiconductor devices.

More specifically, the invention relates to vertical-gate MOS transistors.

2. Description of the Related Art

In the last years, the growing demand of higher and higher integration density of the semiconductor device has brought a reduction in size of the elements used in integrated circuits.

A basic integrated circuit element is the transistor; particularly, in high-density integrated circuits, field-effect transistors are used. The use of integrated transistors in a number of power applications, such as liquid crystal display drivers and the like, has made it necessary to manufacture small size transistors that are nevertheless able to withstand relatively high voltages (for example, 10V-70V). Limitations in the manufacturing of small size field-effect transistors (for example, of the MOS type) often arise from the length of the transistor channel, i.e., the region between the source and drain.

A well-defined channel length is important for the correct operation of the MOS transistor; in fact, many electrical characteristic parameters, such as the transconductance, depend on the transistor channel length.

Moreover, as the channel length becomes smaller, the correct operation of the transistor as a whole is impaired, due for example to short-channel effects, such as punch-through phenomena or a permanently short-circuited channel.

Moreover, as far as MOS transistors for relatively high power applications are concerned, further electrical characteristic parameters that make the manufacturing of a small size MOS transistor troublesome are the voltages that it can withstand at its PN junctions and gate oxide layer; in particular, in order to have the MOS transistor withstand the desired high voltages, these must be lower than the breakdown voltages of both the PN junctions and the gate oxide layer.

As known, the breakdown voltage of the PN junction depends on a certain number of design and manufacturing process parameters, such as the dopant concentration of the regions forming the PN junction and the width of such regions. Particularly, the lower the dopant concentration of the regions forming the PN junction the higher the breakdown voltage. Moreover, in case one or both of the regions forming the PN junction are lightly doped, the width of such regions must be enough to permit the extent of the depletion area in reverse bias condition, and this limits the possibility of reducing the integrated circuit area.

Likewise, the breakdown voltage of the gate oxide layer depends on a certain number of design and manufacturing process parameters, such as for example the thickness of such oxide layer. As known, the higher the thickness of the gate oxide layer the higher the voltage withstood by the MOS transistor. However, a higher thickness of the gate oxide layer reduces the saturation current of the MOS transistor. Thus, the thickness of such oxide layer should be kept relatively low, thereby reducing the voltages that can be withstood by the MOS transistor.

Vertical-gate MOS transistors (also known in the art as V-MOS, U-MOS, folded gate or trench gate transistors) are less affected by short channel effects. In these devices, a trench is formed in a substrate region of a chip of semiconductor material wherein the MOS transistor is integrated. The walls of the trench are covered with the gate oxide layer, and the trench is then filled with a conductive material (typically, a polycrystalline silicon layer) adapted to form the gate electrode (i.e., the trench gate). The source and drain regions of the MOS transistor are formed in the chip of semiconductor material at opposite sides of the trench.

This MOS transistor has a channel region developing along the vertical and bottom walls of the trench, between the source and drain regions. In such a way, even if the overall size of the vertical-gate MOS transistor is reduced, the channel region can be kept sufficiently long so as to prevent the short channel effects.

A vertical-gate MOS transistor is disclosed in the U.S. Pat. No. 4,455,740, which also describes a related manufacturing method.

The Applicants have observed that a vertical-gate MOS transistor realized according to the teachings of such patent is not able to withstand high voltages across the drain-substrate and source-substrate junctions, due to the fact that the drain and source regions are heavily doped ($N^+$) diffusion layers.

The high dopant concentration of the drain and source regions reduces the source-substrate and drain-substrate junctions breakdown voltages, and thus the voltages that can be withstood by such PN junctions. Moreover, the gate oxide layer is not able to sustain high voltages, due to its thin thickness. Both these features make the prior art vertical-gate MOS transistor not particularly adapted for power applications.

The U.S. Pat. No. 6,586,800 proposes a different vertical-gate MOS transistor wherein the drain region consists of a layer buried in the chip of semiconductor material under the channel. The drain current is collected through a metallization formed at the bottom surface of the semiconductor material chip.

As an alternative to the bottom surface drain contact, a top-surface sinker adapted to collect the drain current may be provided, for example, as described in the U.S. Pat. No. 5,124,764.

In both the solutions, the dopant concentration of the drain region (but not of the source region) is chosen according to the desired breakdown voltage of the drain-substrate junction.

As a result, the breakdown voltages are relatively high for the drain-substrate junction, but low for the source-substrate junction. Thus, the proposed MOS transistor is inherently asymmetric; this may be a disadvantage, because in many applications (e.g., pass transistors used as switches) the source and drain regions should be interchangeable.

In any case, the thin gate oxide layer does not allow withstanding high voltages at the drain/source terminals of the MOS transistor.

BRIEF SUMMARY OF THE INVENTION

One embodiment of the present invention provides a solution, which is based on the idea of forming a countersunk trench gate for accommodating an insulation layer with a differentiated thickness.

In particular, one embodiment of the present invention proposes a method for manufacturing a vertical-gate MOS transistor integrated in a semiconductor material chip of a first conductivity type. The semiconductor material chip has a main surface. The method includes the steps of forming a trench gate extending into the semiconductor material chip from the main surface to a gate depth. The step of forming the trench gate includes forming a control gate and an insulation layer for insulating the control gate from the semiconductor material chip. The step of forming the insulation layer includes forming a trench extending into the semiconductor material chip from the main surface to a protection depth lower than the gate depth. The trench has a lateral wall and a bottom wall with an edge portion of the lateral wall (extending from the main surface) being inclined outwardly with respect to the remaining portion of the lateral wall. Said step of forming the insulation layer further includes forming a first auxiliary insulation layer in the trench; removing the first auxiliary insulation layer in correspondence of the bottom wall; extending the trench to the gate depth; and forming a second auxiliary insulation layer in the trench.

BRIEF DESCRIPTION OF THE SEVERAL VIEWS OF THE DRAWINGS

The present invention, as well as further features and the advantages thereof, will be best understood by reference to the following detailed description, given purely by way of a non-restrictive indication, to be read in conjunction with the accompanying drawings, wherein.

DETAILED DESCRIPTION OF THE INVENTION

In the following description, it should be noted that the Figures are not drawn to scale. Relative dimensions and proportions of parts of drawings have been increased or reduced in size for the sake of clarity.

Figure 1:
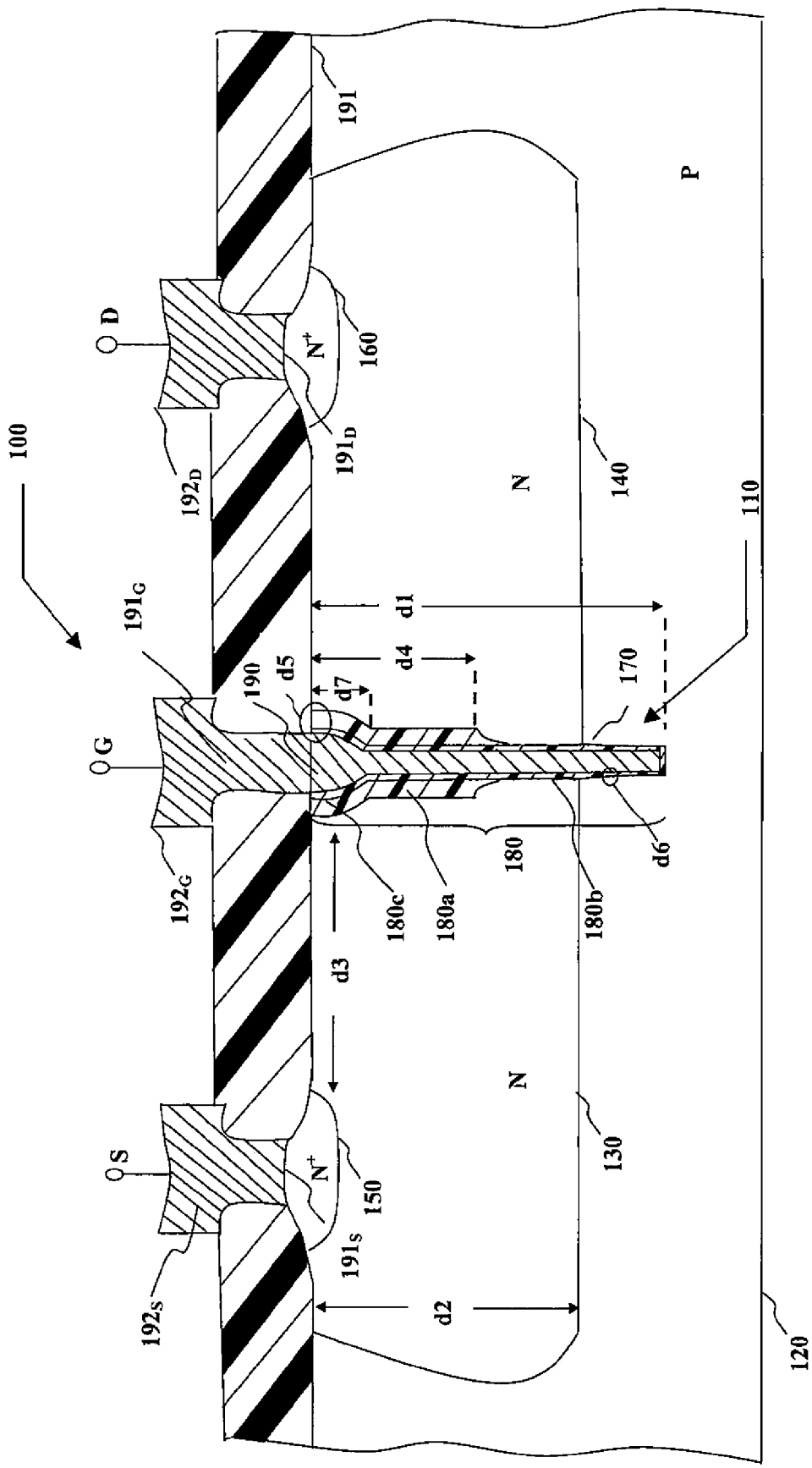
FIG. 1 schematically shows a cross-sectional view of a MOS transistor according to an embodiment of the present invention.

Referring to FIG. 1, a cross-sectional view of a vertical-gate MOS transistor 100 according to an embodiment of the present invention is shown. The MOS transistor 100 includes a trench gate 110, which extends into a semiconductor region 120 (i.e., the chip of semiconductor material wherein the MOS transistor is integrated) of a first type of conductivity (for example, P-type); the trench gate 110 reaches a (gate) depth d1 with respect to the main surface of the semiconductor region 120. At opposite sides of the trench gate 110, two (internal) operative source and drain regions 130 and 140 of a second type of conductivity, opposite to the first one (for example, N-type), extend from the main surface of the semiconductor region 120 to a (region) depth d2. Two (external) contact regions 150 and 160 of the N+ type are formed in the regions 130 and 140, respectively, at a distance d3 (d3>0) from the trench gate 110.

The trench gate 110 is formed into a trench 170 (excavated in the semiconductor region 120 starting from its main surface) and it includes an insulation layer 180 and a polycrystalline silicon layer 190. The insulation layer 180 has an outer portion 180a, covering the walls of the trench 170 starting from the main surface of the semiconductor region 120 to a (protection) depth d4, and an inner portion 180b, covering the deeper walls of the trench 170. The outer portion 180a includes an edge section 180c extending from the main surface of the semiconductor region 120 to an edge depth d7 and which is inclined outwardly with respect to the remaining section of the outer portion 180a. For example, the edge depth d7 ranges preferably from 10% to 20% and more preferably from 11% and 15% (for example, 13%) of the depth d4; moreover, the edge section 180c is inclined at an angle preferably ranging from 30° to 45°, and more preferably from 35° to 40° (for example, 37°). The outer portion 180a and the inner portion 180b have a respective thicknesses d5 and d6. The polycrystalline silicon layer 190 fills the trench 170, which is covered by the insulation layer 180.

A field oxide layer 191 covers the main surface of the semiconductor region 120 except for two active area windows $191_S$ and $191_D$ over the contact regions 150 and 160, respectively (where source and drain contacts are realized), and a window $191_G$ over the free surface of the polycrystalline silicon layer 190 (where the gate contact is realized). Three metallizations $192_S$, $192_G$, and $192_D$ fill the windows $191_S$, $191_G$, $191_D$ and form the source S, gate G, and drain D terminals, respectively, of the MOS transistor 100.

In the MOS transistor 100, a channel region is formed by a portion of the semiconductor region 120, which is located between the internal source region 130 and the internal drain region 140; such channel region develops along the vertical and bottom walls of the trench gate 110. The MOS transistor 100 thus has a vertical-gate structure, which allows achieving a relatively high channel length at the same time avoiding an excessive area occupation of the integrated circuit. In particular, it is possible to shrink the lateral dimension of the MOS transistor 100, without for this reason incurring in short-channel effects (because the channel length can be increased by increasing the depth d1 of the trench gate 110).

The insulation layer 180 has the inner portion 180b with the thickness d6 that is lower than the thickness d5 of the outer portion 180a. Preferably, the thickness d6 ranges from 15% to 40% and more preferably from 20% to 30% (such as 25%) of the thickness d5. For example, the thickness d6 is about 90 nm and the thickness d5 is about 350 nm. The presence of the thin inner portion 180b (for example, a gate oxide) along the walls of the trench 170 adjacent to the channel ensures a high saturation current of the MOS transistor 100. In fact, as mentioned above, the lower the thickness d6 of the inner portion 180b, the higher the saturation current of the MOS transistor 100.

On the other hand, the thick outer portion 180a is able to sustain higher voltages before breaking. In such a way, the voltage which can be withstood by the MOS transistor 100 (i.e., between the gate terminal G and the drain/source terminals S/D) is increased (always remaining lower than the breakdown voltage of the insulation layer 180).

The depth d4 of the outer portion 180a is lower than the depth d2 of the source and drain regions 130, 140 (and then lower than the depth d1 of the trench gate 110). Preferably, the depth d4 ranges from 20% to 60% and more preferably from 30% to 50% (such as 35%) of the depth d1. For example, the depth d1 is 3.6 µm, the depth d2 is about 2.4 µm and the depth d4 ranges from 1.5 µm to 1.8 µm (such as 1.5 µm). In such a way, as better described in greater detail with reference to FIG. 2, the overall performance of the MOS transistor 100 is improved when it is reverse biased (i.e., when it is turned off).

Moreover, the fact that the contact regions 150 and 160 are spaced apart (at the distance d3) from the trench gate 110 further reduces the voltage stress at the insulation layer 180.

In fact, the voltage that is applied to the insulation layer 180 is reduced by an amount equal to the voltage drop at the portion of the semiconductor region 120 extending horizontally along the distance d3. Preferably, the distance d3 ranges from 0.3 μm to 2 μm according to the requested breakdown voltage, and more preferably from 0.5 μm to 1.5 μm. For example, the distance d3 is about 1 μm.

The internal source region 130 and the internal drain region 140 are relatively lightly doped; for example, they have a dopant concentration preferably ranging from $1*10^{15}$ ions/cm$^3$ to $1*10^{17}$ ions/cm$^3$, and more preferably from $5*10^{15}$ ions/cm$^3$ to $5*10^{16}$ ions/cm$^3$ (such as $1*10^{16}$ ions/cm$^3$). Thus, a breakdown voltage of the junctions between the source/drain regions 130, 140 and the semiconductor region 120 is kept relatively high; in this way the vertical-gate MOS transistor 100 is capable of withstanding high voltages.

The contact regions 150 and 160 are instead heavily doped; for example, they have a dopant concentration preferably ranging from $1*10^{19}$ ions/cm$^3$ to $1*10^{21}$ ions/cm$^3$, and more preferably from $5*10^{19}$ ions/cm$^3$ to $5*10^{20}$ ions/cm$^3$ (such as $1*10^{20}$ ions/cm$^3$). In this way, it is ensured that the contacts with the metallizations $192_S$, $192_D$ are low-resistance, non-rectifying (i.e., ohmic) contacts.

Figure 2:
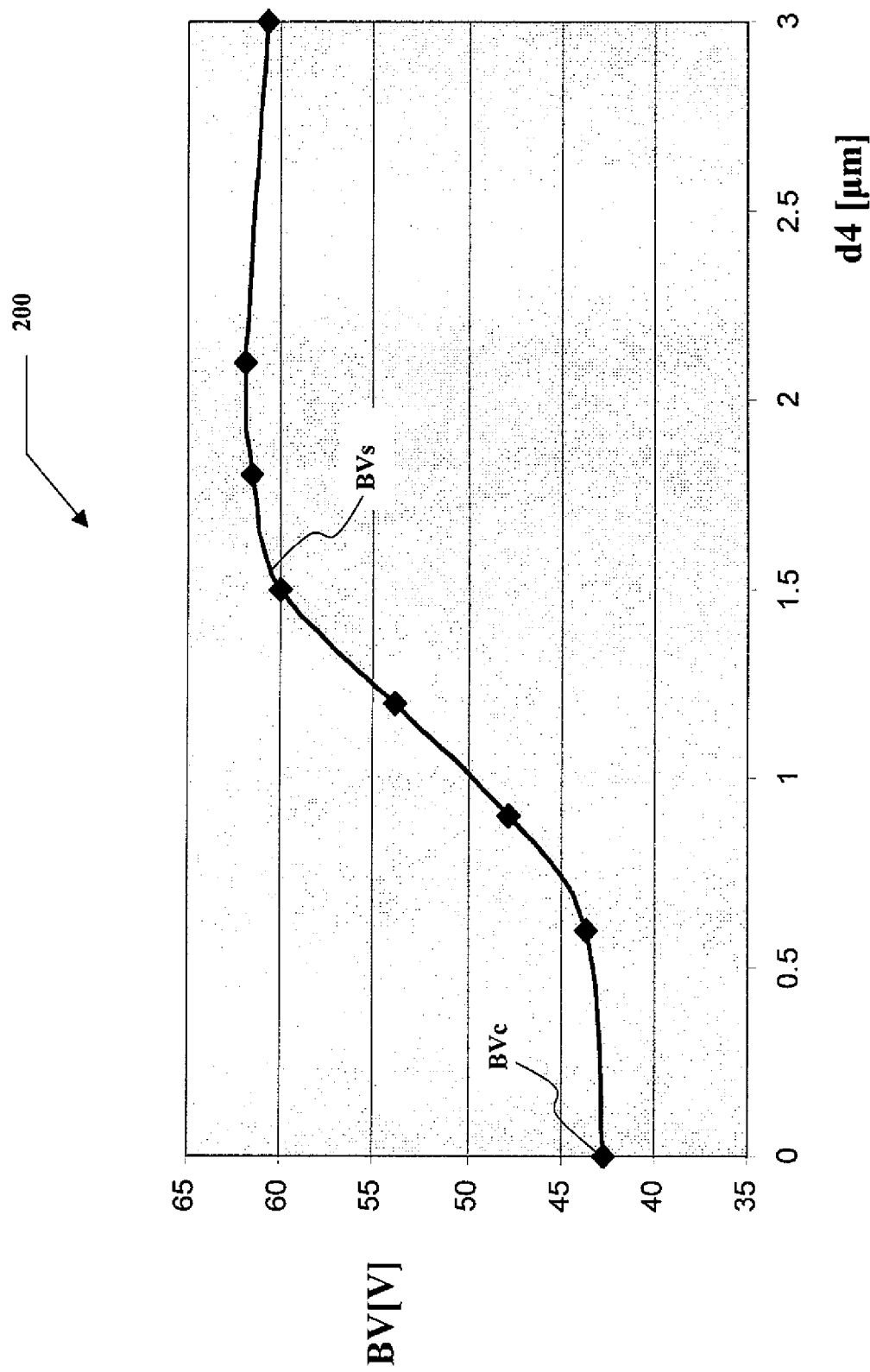
FIG. 2 shows an exemplificative diagram relating to electrical operative parameters of the MOS transistor according to an embodiment of the present invention.

Referring to FIG. 2 together with FIG. 1, there is shown an exemplificative diagram 200 representing the breakdown voltage (BV) at the gate-source (or drain) terminals depending on the depth d4 (with the depth d1 equal to 3 μm). The diagram 200 has the breakdown voltage (BV) on the axis of the ordinates and the depth d4 on the axis of the abscissas. As it can be noted, the breakdown voltage BV has a constant value BVc (about 43 V) when the depth d4 ranges from 0 to 0.6 μm. Then, the breakdown voltage BV linearly increases up to reach a saturation breakdown voltage BVs (about 62 V) when the external portion 180a extends to a depth d4 of about 1.8 μm. For depths d4 higher than 1.8 μm, the breakdown voltage BV remains approximately constant and equal to the saturation breakdown voltage BVs. Therefore, in order to reach the maximum allowable breakdown voltage BV, the depth d4 should be at least equal to 1.8 μm. However, it is preferable not to exceed this value; indeed, any increase of the depth d4 has no effect on the breakdown voltage BV but it reduces the saturation current of the MOS transistor 100.

Referring now to FIGS. 3A through 3L, a manufacturing process of the MOS transistor according to an embodiment of the present invention will be explained in detail.

Figure 3A:
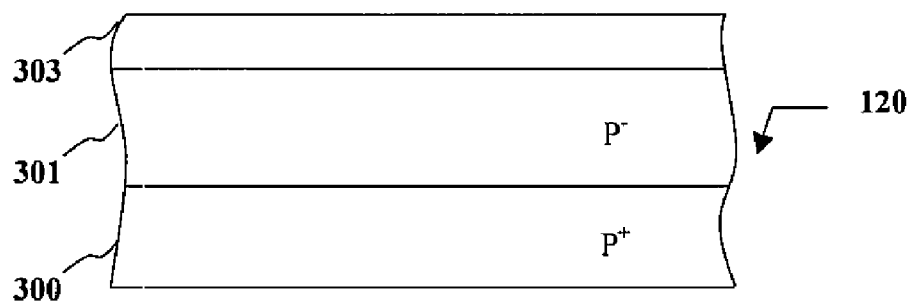
FIGS. 3A through 3L are cross-sectional views illustrating the main steps of the manufacturing of the MOS transistor, according to an embodiment of the present invention.

Considering in particular FIG. 3A, starting from a semiconductor material layer 300 (for example, the silicon wafer substrate) of the P type with a dopant concentration ranging from $5*10^{18}$ ions/cm$^3$ to $5*10^{19}$ ions/cm$^3$, a less doped layer 301 (of the P-type) is epitaxially grown over it; for example, the epitaxial layer 301 may have a dopant concentration ranging from approximately $5*10^{14}$ ions/cm$^3$ to approximately $5*10^{15}$ ions/cm$^3$ and a thickness of about 10 μm. Successively, a thin silicon nitride layer 303, with a thickness of about 100 nm, is deposited on top of the epitaxial layer 301, for example, by a CVD (acronym for Chemical Vapor Deposition) process.

Figure 3B:
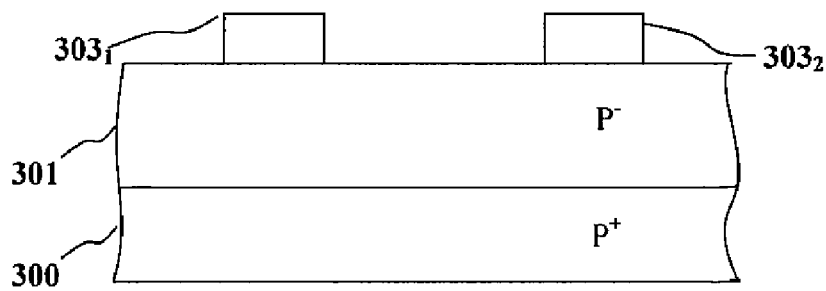

Thereafter, the thin silicon nitride layer 303 is selectively etched and removed, using a conventional photoetching process, as shown in FIG. 3B. As a result, two silicon nitride portions $303_1$ and $303_2$ remain to cover the epitaxial layer 301.

Figure 3C:
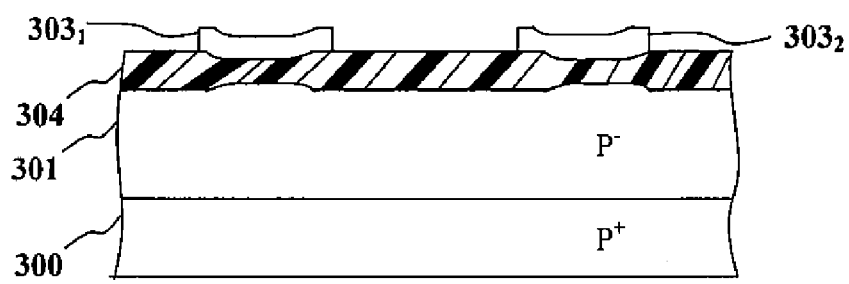

Moving to FIG. 3C, the wafer is then subjected to a thermal oxidation treatment, whereby a (field) oxide layer 304 is grown. This technique (known as LOCOS) allows obtaining regions that are thinner where the epitaxial layer 301 is covered by the silicon nitride portions $303_1$ and $303_2$. In alternative, the same result is obtained by other techniques, such as the STI (acronym for Shallow Trench Isolation) and Recessed LOCOS techniques.

Figure 3D:
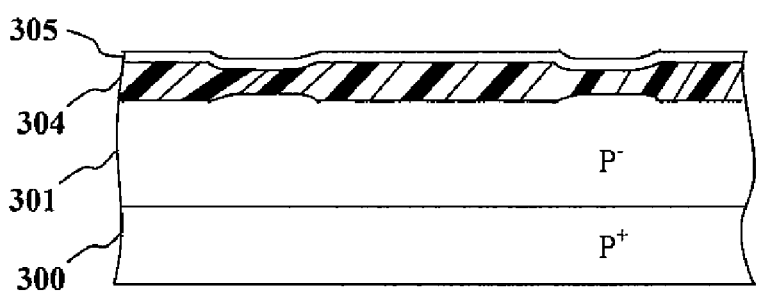

As shown in FIG. 3D, after the removal of the silicon nitride portions $303_1$ and $303_2$, a further thin silicon nitride layer 305 is formed over the surface of the structure, e.g., by a CVD process.

Figure 3E:
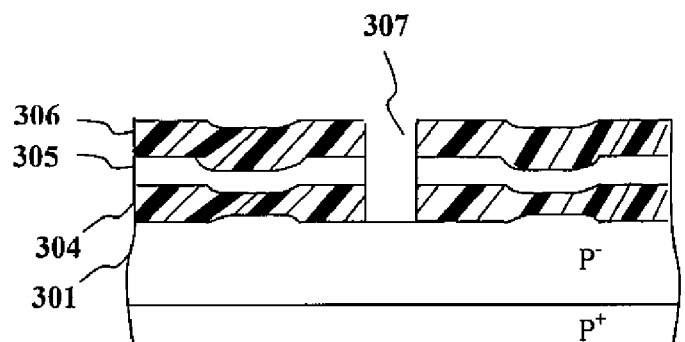

Moving to FIG. 3E, an oxide layer 306 is then formed (e.g., deposited) on top of the thin silicon nitride layer 305. A first trench portion 307 is then formed, by selectively etching the layers 304, 305 and 306. In order to form the first trench portion 307, a photoresist mask (not shown in the figure) is provided on the oxide layer 306, so as to leave exposed an area of the layer 306 where the first trench portion 307 is to be formed. Using suitable etching techniques, the layers 306, 305 and 304 are selectively removed, down to the surface of the epitaxial layer 301.

Figure 3F:
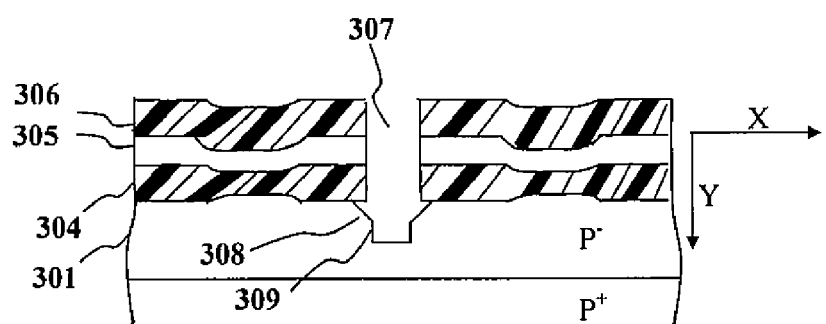

Thereafter, as shown in FIG. 3F, the first trench portion 307 is extended down to the depth d4 (for example, 1.5 μm) by selectively etching the epitaxial layer 301, with the layers 304, 305 and 306 used as a mask. In such a way, the first trench portion 307 is adapted to accommodate the outer portion of the insulation layer (for the trench gate).

The etching is performed by two processes, each one having a corresponding isotropic degree with respect to two directions X (lateral) and Y (vertical).

More in detail, the isotropic degree (in the following referred to as AD) is defined through the following expression:

$$AD = x/y$$

wherein y is the etching depth along the direction Y and x is the etching depth along the direction X.

In particular, the first etching has an isotropic degree preferably equal to 90%-100%, and more preferably equal to 95%-100%, for example about 100% (meaning that the epitaxial layer 301 is equally etched vertically and laterally so as to form an edge sloped portion 308 adapted to accommodate the edge section of the insulation layer). In other words, the edge sloped portion 308 generates an undercut below the oxide layer 304.

The second etching has instead an isotropic degree theoretically equal to about 0, such as lower than 5% and more preferably lower than 2% (meaning that the epitaxial layer 301 is only vertically etched so as to form a straight portion 309 adapted to accommodate the remaining section of the insulation layer).

Then, a thermal oxidation should be performed for growing the desired insulation layer. However, the preceding etching process may affect the quality of the oxide that will be subsequently grown on the walls of the trench portions 308 and 309. In order to avoid this problem, the wafer is then subjected to a thermal annealing process into an environment saturated with hydrogen (H2), at an annealing temperature preferably ranging from 900° C. to 1100° C., and more preferably from 950° C. to 1050° C. (for example, 1000° C.). During this phase, the wafer is heated by a thermal process, for example by RTP (acronym for Rapid Thermal Process), up to the annealing temperature and subsequently cooled in the same environment (including H2 only).

In such a way, the thermal annealing process allows the silicon molecules belonging to the walls of the trench portions 308 and 309 to arrange along their preferential directions, so resolving the above mentioned problem (without requiring any further etching of the epitaxial layer 301 or re-oxidation of the silicon).

Figure 3G:
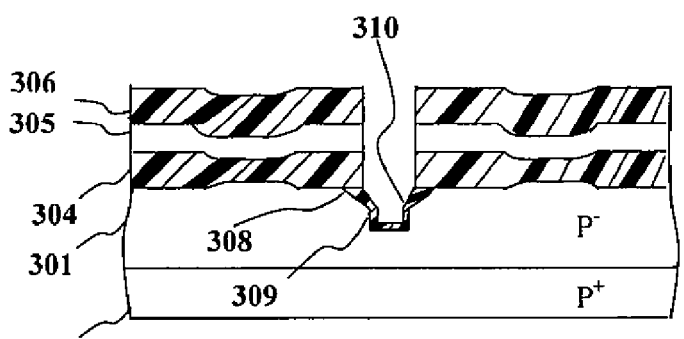
Figure 3H:
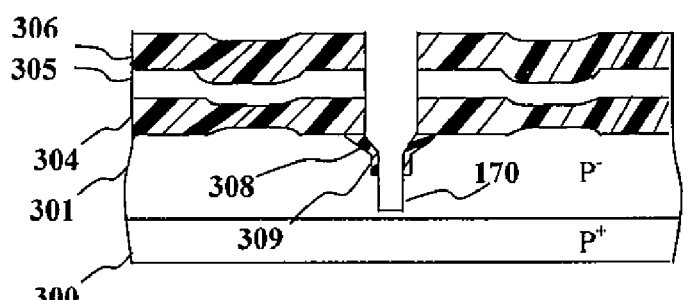

Then, a thermal oxidation is performed in order to form a first auxiliary insulation layer 310 (oxide) on the walls of the trench portions 308 and 309, as shown in FIG. 3G. As described in greater detail in the following, the first auxiliary insulation layer 310 has a (first) thickness depending on the difference between the thickness of the outer portion and the one of the inner portion of the insulation layer for the trench gate. Thereafter, the first auxiliary insulation layer 310 is selectively etched by using a suitable self-aligned process having a very low isotropic degree (for example, at most 2%). In such a way, the portion of the first auxiliary insulation layer 310 covering the bottom of the portion 309 is totally removed. However, even though the etching process is strongly anisotropic, a very thin portion of the first auxiliary insulation layer 310 is also removed from the lateral walls of the trench portion 308, and in particular from the portion of the walls being near the main surface of the wafer. However, this is not a problem since the sloped edge portion 308 in any case allows the first auxiliary insulation layer 310 to reach the desired thickness (since before the etching process such thickness is slightly greater than the desired one). Thereafter, as shown in FIG. 3H, the epitaxial layer 301 is further etched down to the depth d1 so forming the trench 170, with the layers 304, 305, 306 and 310 used as a mask. In the example at issue, the resulting trench 170 has a depth equal to 3.6 μm.

As described in the foregoing, also these etching may affect the quality of the oxide, which will be subsequently formed on the walls of the trench 170. In order to avoid this problem, the wafer is subjected to a further annealing process with similar operative parameters as in the preceding case. In such a way, the quality of a subsequent grown oxide or of an interface with a subsequent deposited oxide will be improved for the desired purpose.

Figure 3I:
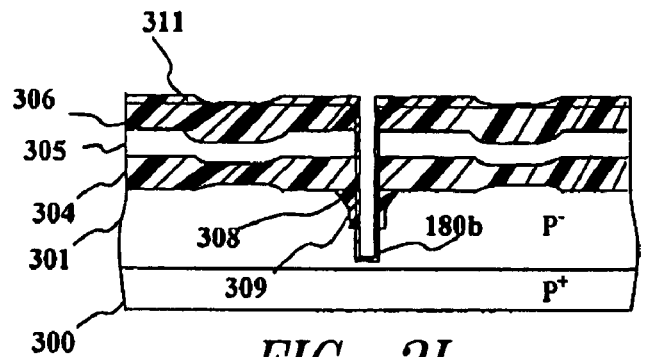

Moving to FIG. 3I, a second auxiliary insulation layer 311 is deposited, for example, by a CVD process. The second auxiliary insulation layer 311 has a (second) thickness corresponding to the one of the inner portion of the insulation layer of the trench gate (90 nm, in the example at issue). In this case, the thickness of the first auxiliary insulation layer 310 is exactly the difference between the thicknesses of the outer portion and of the inner portion (260 nm, in the example at issue). The second auxiliary insulation layer 311 covers the entire surface of the wafer, including the lateral and bottom walls of the trench 170.

It should be noted that the preceding annealing steps allow obtaining an insulation layer with a quite uniform thickness even along the curvature near the bottom wall of the trench 170; for example, this thickness is 15%-30% greater than the one that would have been obtained without the annealing steps.

Alternatively, in order to form the inner portion of the insulation layer of the trench gate, the second oxide layer can be thermally grown along the walls of the trench 170. In this case, however, the thickness of the second auxiliary insulation layer where the trench 170 is already covered by the first auxiliary insulation layer 310 is lower than the one where the trench is completely exposed; more specifically the thickness of the second auxiliary insulation layer depends non-linearly (for example, according to a square root law) on the thickness of the first auxiliary insulation layer 310. Moreover, the first auxiliary insulation layer 310 can be subjected to a certain numbers of surface treatments that reduce its thickness before the growing of the second auxiliary insulation layer. For these reasons, the thickness of the first auxiliary insulation layer 310 should be higher than the difference between the thicknesses of the outer portion and the one of the inner portion of the insulation layer for the trench gate (for example, 350 nm in the example at issue).

Figure 3J:
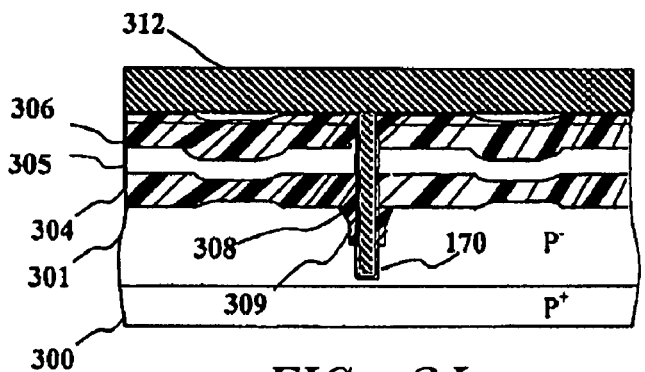
Figure 3K:
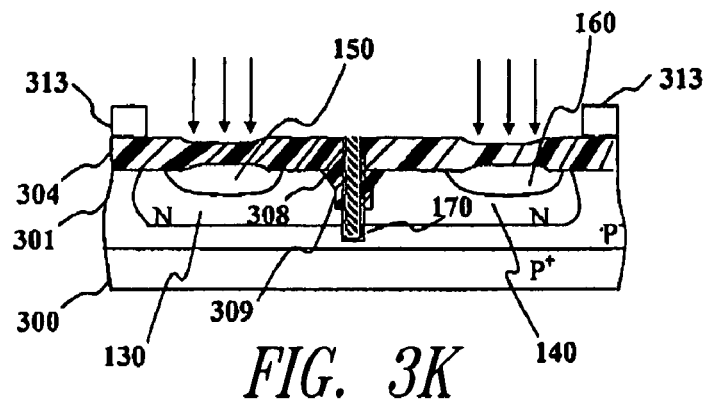

Thereafter, as shown in FIG. 3J, a polycrystalline silicon layer 312 is formed by the CVD process over the top of the wafer, at the same time filling the trench 170. Considering now FIG. 3K, the above described layers are removed down to the surface of the field oxide layer 304. A mask 313 adapted for implantation processes is then formed on the oxide layer 304 (for the subsequent dopant implantation processes).

A first dopant implantation process is performed, for forming the internal operative source and drain regions 130 and 140 of the MOS transistor; for example, in order to form N-type source and drain regions, arsenic or phosphorus dopant ions may be used.

Particularly, the first implantation process is performed at a relatively high energy, for example up to 2 or 3 MeV, in order to cause the dopant ions to penetrate through the field oxide layer 304 and the epitaxial layer 301, down to the depth d2 (whereas where the mask 313 is present the dopants do not reach the surface of the epitaxial layer 301).

Preferably, the dopants, after having been implanted, are simply activated by a high thermal budget (such as, 1000° C.) Rapid Thermal Process, without being made to diffuse into the epitaxial layer.

Alternatively, the source and drain regions may be graded doped junctions. In this case it is possible to perform more than one dopant implantation process, at different, relatively high energies, for example, 200 keV, 400 KeV, 1000 keV and 2500 keV.

Successively, still using the mask 313, a second dopant implantation process is performed in order to form the heavily doped contact regions 150 and 160 of the N-type. In particular, the second dopant implantation process is performed at an energy, which is sufficiently high to cause the dopants to penetrate the thinner portions of the field oxide layer 304, but at the same time too low to cause the dopants to penetrate the thicker portions of the field oxide layer 304. For example, arsenic ions are implanted at energy of approximately 50 KeV, adapted to concentrate the dopant distribution close to the surface of the wafer.

Figure 3L:
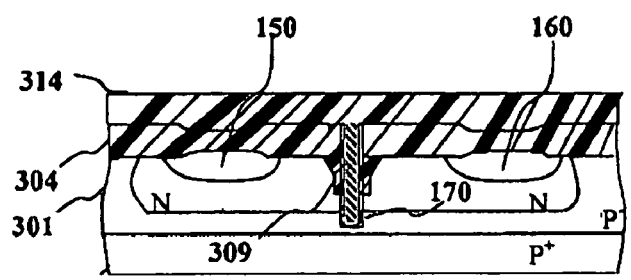

Thereafter, as shown in FIG. 3L, a silicon oxide layer 314 is deposited over the field oxide layer 304, by a CVD process. For realizing the drain, source and gate, windows are formed by etching the oxide layers 314 and 304, down to the surface of the contact regions 150 and 160.

Afterwards, a metallization layer, (for example, Al or Ti/TiN plus a W-plug and an Al layer) is deposited on the oxide layer 314, and the source, drain and gate contacts are formed, so as to obtain the structure described above with reference to FIG. 1.

Figure 4:
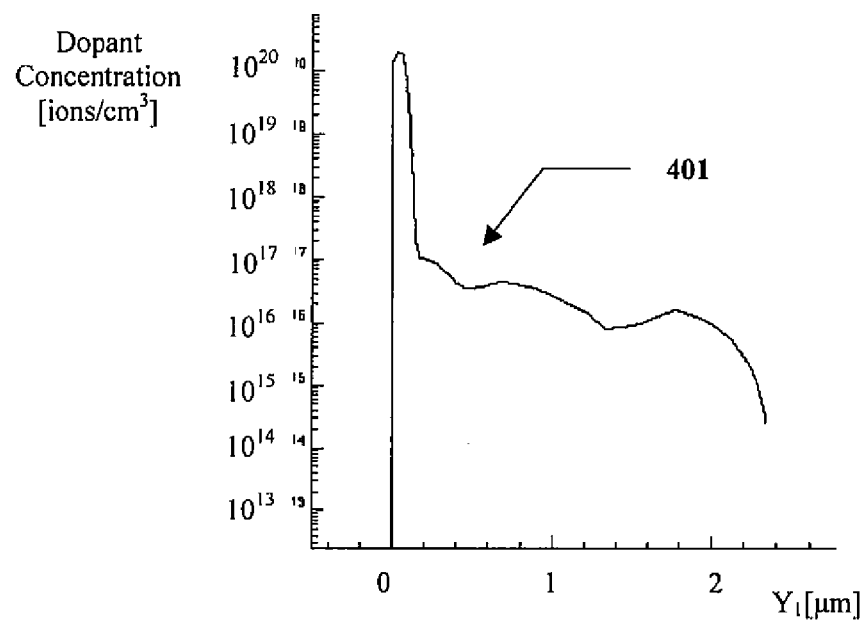
FIG. 4 shows exemplificative dopant concentration profiles of the drain and source regions of the MOS transistor, according to an embodiment of the present invention.
Figure 4:
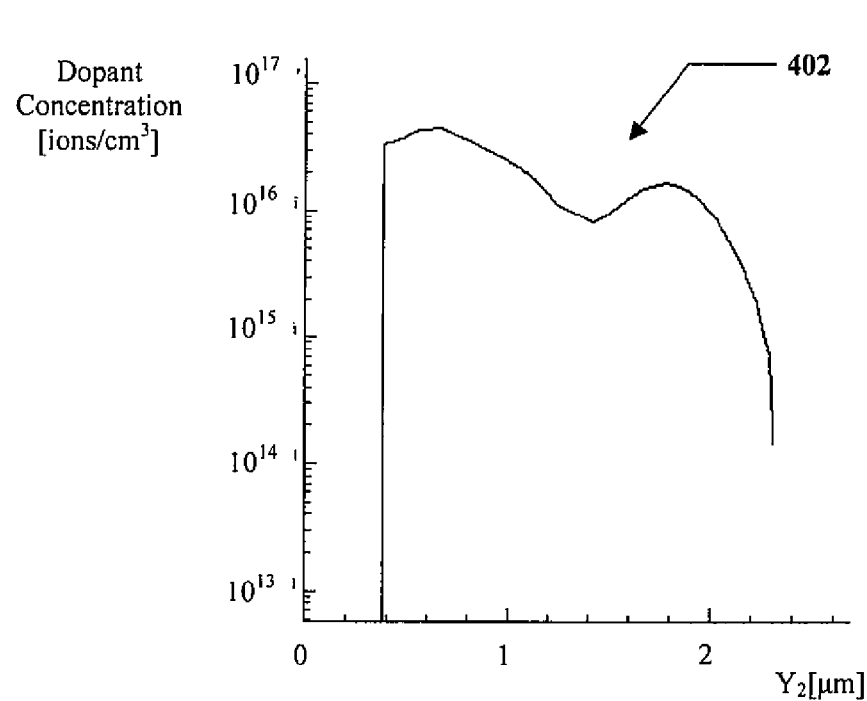
Figure 4:
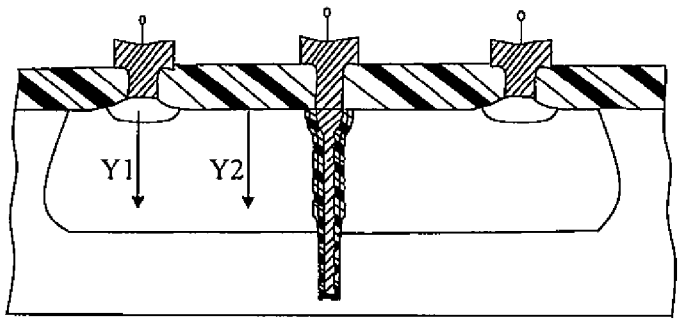

In FIG. 4, there are shown profiles 401 and 402 of the dopant concentration of the drain/source regions of the MOS transistor 100 along the axis $Y_1$ and $Y_2$, respectively.

In particular, the profile 401 shows the dopant concentration of the region under the drain/source terminals, while the profile 402 shows the dopant concentration of the regions under the field oxide layer.

Both the profiles are chosen in order to optimize a number of MOS transistor parameters, such as the current capability, the on-resistance, the safe operating area (SOA) and the breakdown voltages, as better described in the following.

In particular, referring to the profile 401, the dopant concentration of the regions closer to the surface of the structure is higher than that in the deep regions. This allows realizing the ohmic contacts of the MOS transistor. Moreover, the lower dopant concentration of the deeper regions allows increasing the breakdown voltage of the MOS transistor.

Moving now to the profile 402, it should be noted that the dopant concentration of the regions under the field oxide layer is always lower than the dopant concentration of the drain/source contact regions. Also this choice allows increasing the breakdown voltage.

In this way, it is possible to obtain a MOS transistor capable of withstanding voltages ranging from 50 to 60V, having a pitch of 3.5 µm, whereas the conventional horizontal-gate structures are capable of withstanding the same voltages but with a pitch of 11.5 µm, so occupying more space.

Figure 5:
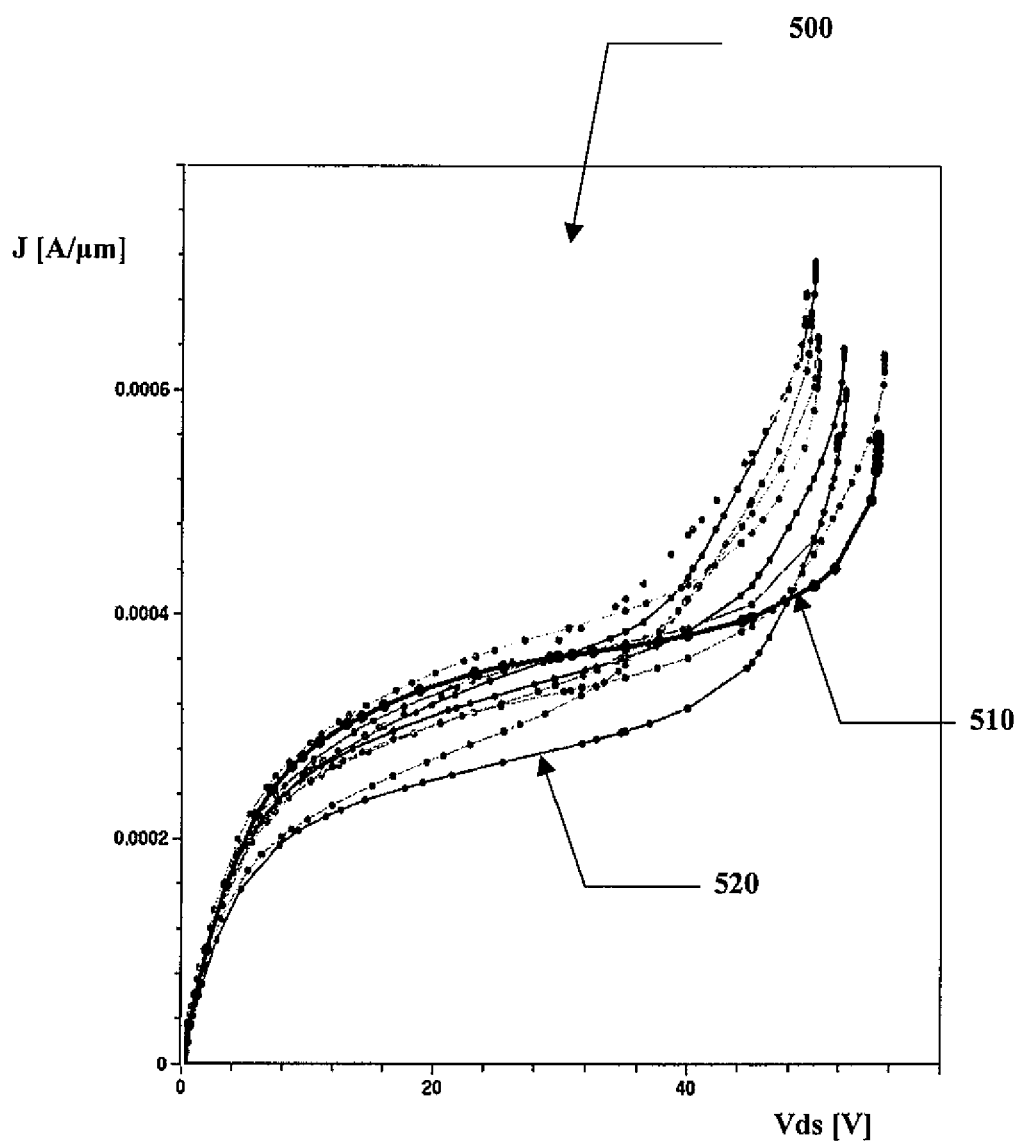
FIG. 5 shows illustrative diagrams explaining the operation of the MOS transistor, according to an embodiment of the present invention.

Referring to FIG. 5, a diagram 500 shows a set of working characteristics of the MOS transistor depending on the dopant concentration of the source and drain regions. In particular, the diagram 500 has a current density J[A/µm] on the axis of the ordinates, and a biasing voltage Vds[V] at the MOS transistor (i.e., the voltage applied between the drain terminal and the source terminal) on the axis of the abscissas.

As can be seen, a working characteristic 510 is obtained for a MOS transistor having the profiles of the dopant concentrations of the drain and source regions shown in FIG. 4. The remaining working characteristics are obtained for non-optimized MOS transistors, that is with different profiles of the dopant concentrations.

As it can be noted, the working characteristic 510 has a saturation current density J ranging from 350 µA/µm to 450µA/µm and a breakdown voltage about 55V. Both values are higher than the saturation current density and the breakdown voltage of the other working characteristics (for example, the working characteristic 520 has a saturation current density ranging from 250 µA/µm to 350 µA/µm and a breakdown voltage of about 40V).

Thus, by suitably choosing the dopant concentration of the drain and source regions (and then the energy for the implantation processes) it is possible to optimize the trade-off between the value of the saturation current density J flowing in the MOS transistor and the voltage which is withstood by it.

Figure 6:
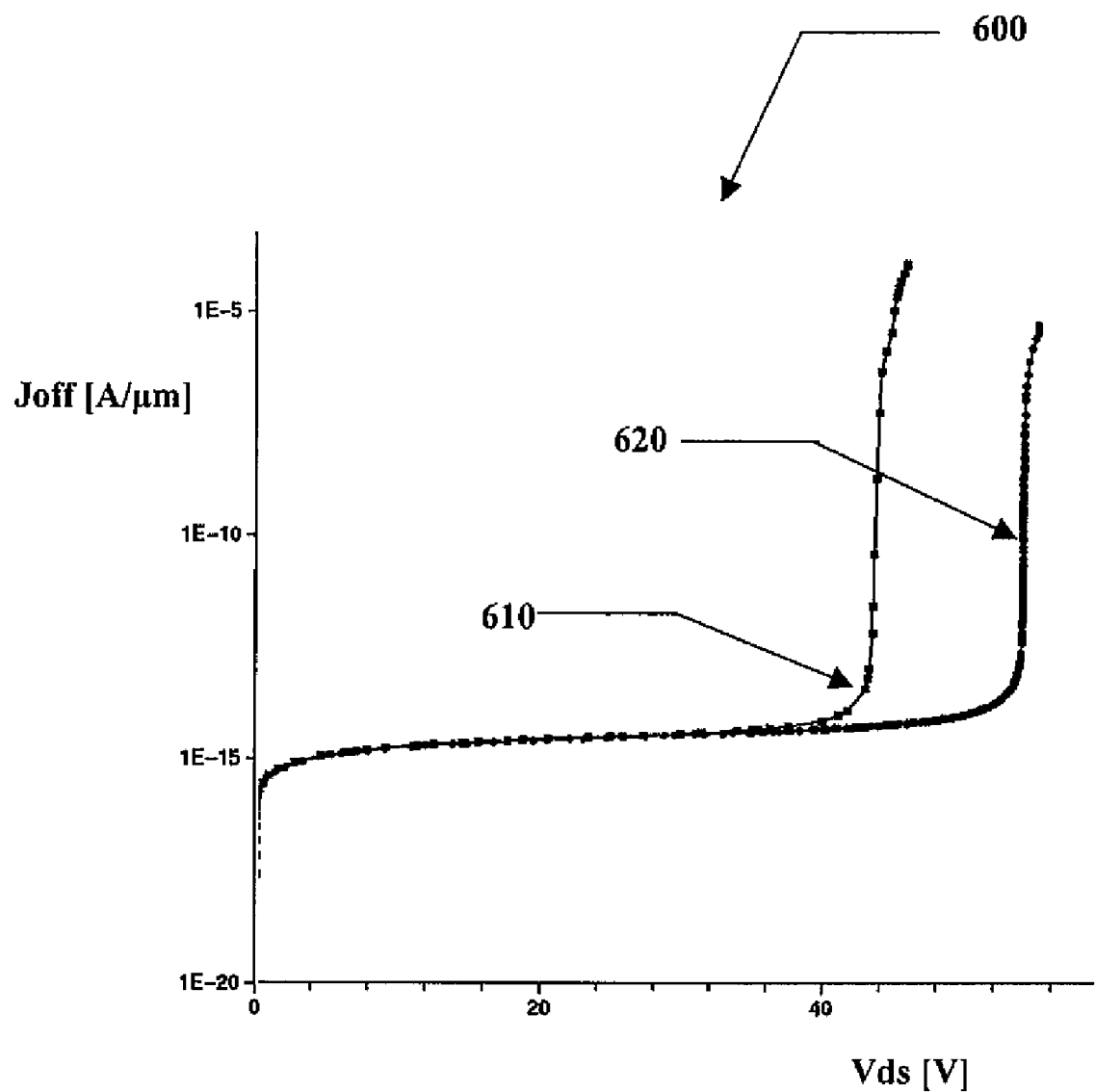
FIG. 6 shows further exemplificative diagrams explaining the operation of the MOS transistor, according to an embodiment of the present invention.

Finally, referring to FIG. 6 there is shown a diagram 600 having a quenching current density Joff [A/µm] on the axis of the ordinates, and the value of the biasing voltage Vds [V] at the MOS transistor on the axis of the abscissas. The diagram 600 shows two curves 610 and 620. The first one (curve 610) is obtained for a conventional MOS transistor having a single oxide layer with a thin thickness adapted for being a gate oxide. The second one (curve 620) is obtained for the MOS transistor that, as described in an embodiment of the present invention, has the insulation layer with a differentiated thickness. As it can be noted, exploiting the above-described structure, it is possible to obtain a MOS transistor capable of sustaining voltages ranging from 50 to 60V (curve 620).

In fact, the proposed solution allows reducing the thinning of the oxide layer near the surface of the semiconductor material chip, thereby increasing the value of the voltages sustained at the MOS transistor.

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, although in the preceding description reference has been made to an N-channel MOS transistor, the conductivity types of the various regions may be reversed, so as to form a P-channel MOS transistor.

Moreover, the drain and source regions may be formed in another way, (e.g., by epitaxial growth), or the trench gate may be formed by using a metal material instead of polycrystalline silicon.

Moreover, it is possible to manufacture the vertical-gate MOS transistor easily into a structure including conventional horizontal-channel transistors as well (i.e., with the channel region developing horizontally between the source and drain regions).

In any case, different ways for realizing the trench with the inclined edge section are contemplated.

For example, a first etching with a different isotropic degree may be used.

Moreover, a second etching, which is not completely anisotropic, may be used in order to extend the trench.

In alternative, it is also possible to deposit both the auxiliary insulation layers.

In any case, different thicknesses of the first and the second auxiliary insulation layers are contemplated.

It should be noted that the proposed values of the tilting angle of the edge portion and/or of the depth reached by the latter must not be interpreted in a limitative manner.

Moreover, the thicker portion of the insulation layer may also reach the channel of the MOS transistor (even if this would impair its performance).

In any case, other values of the protection depth are included.

Moreover, the solution of the invention is also suitable to be implemented in MOS transistors having one only between the source and drain regions adjacent to the insulated trench gate (with the other region which is buried under the channel).

In any case, it is possible to use different profiles of the dopant concentrations.

Similar considerations apply if the steps of annealing are carried out at different temperatures and/or in another environment. In any case, those steps are not strictly necessary and may be omitted (at the cost of degrading the performance of the device).

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

The invention claimed is:

1. A method for manufacturing a vertical-gate MOS transistor integrated in a semiconductor chip of a first conductivity type, said semiconductor chip having a main surface, the method comprising:

forming a trench gate extending into the semiconductor chip from the main surface to a gate depth, said step of forming the trench gate including the steps of forming a control gate and forming an insulation layer for insulating the control gate from the semiconductor chip, wherein the step of forming the insulation layer includes:

forming a trench extending into the semiconductor chip from the main surface to a protection depth less than the gate depth, the trench having a lateral wall and a bottom wall with an edge portion of the lateral wall extending from the main surface being inclined outwardly with respect to a remaining portion of the lateral wall;

forming a first auxiliary insulation layer in the trench;
removing a bottom wall of the first auxiliary insulation layer in correspondence with the bottom wall of the trench;
extending the trench to the gate depth; and
forming a second auxiliary insulation layer in the trench.

2. The method according to claim 1, wherein the step of forming the trench includes:
selectively etching the semiconductor chip by a first etching; and
selectively etching the semiconductor chip by a second etching, the first etching having a first isotropic degree, defined by a ratio between a lateral etching depth along a direction parallel to the main surface and a vertical etching depth along a direction perpendicular to the main surface, and the second etching having a second isotropic degree lower than the first isotropic degree.

3. The method according to claim 2, wherein the first isotropic degree is in a range from 90% to 100% and the second isotropic degree is substantially zero.

4. The method according to claim 1, wherein the step of forming the first auxiliary insulation layer includes thermally growing the first auxiliary insulation layer.

5. The method according to claim 1, wherein the step of forming the second auxiliary insulation layer includes depositing the second auxiliary insulation layer.

6. The method according to claim 5, wherein the first auxiliary insulation layer has a first thickness and the second auxiliary insulation layer has a second thickness, the second thickness being in a range from 18% to 66% of the first thickness.

7. The method according to claim 1, wherein the step of forming the second auxiliary insulation layer includes thermally growing the second auxiliary insulation layer.

8. The method according to claim 1, wherein the step of removing the bottom wall of the first auxiliary insulation layer and/or the step of extending the trench to the gate depth includes selectively etching the first auxiliary insulation layer and/or the semiconductor chip by an etching having an isotropic degree which is substantially zero.

9. The method according to claim 1, wherein the edge portion is inclined at an angle in a range from 30° to 45°.

10. The method according to claim 1, wherein the edge portion extends from the main surface to an edge depth, said edge depth being in a range from 10% to 20% of the protection depth.

11. The method according to claim 1, further comprising the step of forming a source region and a drain region of a second conductivity type into the semiconductor chip, at least one of the source region and drain region being adjacent to the trench gate and extending into the semiconductor material chip from the main surface to a region depth less than the gate depth.

12. The method according to claim 11, wherein the protection depth is less than the region depth.

13. The method according to claim 1, wherein the protection depth ranges from 20% to 60% of the gate depth.

14. The method according to claim 11, wherein each one of the source region and the drain region is adjacent to the insulation layer and extends into the semiconductor chip to the region depth.

15. The method according to claim 11 wherein the step of forming the source region and the drain region includes the step of forming source and drain contact regions extending from the main surface at a non-zero distance from the trench gate and source and drain internal regions, said source and drain internal regions having a first dopant concentration and said contact regions having second dopant concentration higher than the first dopant concentration.

16. The method according to claim 15, wherein the second dopant concentration ranges from $10^2$ to $10^6$ times the first dopant concentration.

17. The method according to claim 16, wherein the second dopant concentration ranges from $1*10^{19}$ ions/cm$^3$ to $1*10^{21}$ ions/cm$^3$ and the first dopant concentration ranges from $1*10^{15}$ ions/cm$^3$ to $1*10^{17}$ ions/cm$^3$.

18. The method according to claim 1, wherein the step of forming the insulation layer further includes annealing the semiconductor chip before forming the first auxiliary insulation layer.

19. The method according to claim 1, wherein the step of forming the insulation layer further includes annealing the semiconductor chip after extending the trench to the gate depth and before forming the second auxiliary insulation layer.

20. The method according to claim 19, wherein the annealing includes:
heating the semiconductor chip at a temperature in a range from 900° C. to 1100° C.

21. The method according to claim 19, wherein the annealing is performed in an environment saturated with hydrogen.

22. A method for manufacturing a vertical-gate MOS transistor integrated in a semiconductor chip of a first conductivity type, said semiconductor chip having a main surface, the method comprising:
forming a trench gate extending into the semiconductor chip from the main surface to a gate depth, wherein forming the trench gate includes:
forming a trench extending into the semiconductor chip from the main surface to the gate depth, the trench having a lateral wall and a bottom wall;
forming an upper trench insulation region coating an upper portion of the lateral wall of the trench;
forming lower trench insulation region coating the bottom wall and a lower portion of the lateral wall of the trench; and
forming a conductive control gate in the trench and laterally surrounded by the upper and lower trench insulation regions, wherein forming the trench includes:
forming an initial trench extending into the semiconductor chip from the main surface to a protection depth less than the gate depth; and
after forming the upper trench insulation region in the initial trench, extending the initial trench to the gate depth by etching an area of the semiconductor chip below the initial trench, wherein forming the trench includes forming an edge portion of the upper portion of the lateral wall of the trench, the edge portion extending from the main surface and being inclined outwardly with respect to a remaining portion of the upper portion of the lateral wall of the trench.

23. The method of claim 22 wherein the upper trench insulation region has a lateral wall thickness greater than a lateral wall thickness of the lower trench insulation region.

24. The method of claim 22 wherein forming the upper trench insulation region includes:
forming a first auxiliary insulation layer in the initial trench;
removing a bottom wall of the first auxiliary insulation layer; and
after extending the initial trench to the gate depth, forming a second auxiliary insulation layer in the trench, the upper trench insulation region including a lateral wall of the first auxiliary insulation layer and an upper lateral wall of the second auxiliary insulation layer.

25. The method of claim 24, wherein the first auxiliary insulation layer has a first thickness and the second auxiliary insulation layer has a second thickness, the second thickness being in a range from 18% to 66% of the first thickness.

26. The method of claim 22, wherein forming the trench includes:
   selectively etching the semiconductor chip by an isotropic first etching to form the edge portion; and
   selectively etching the semiconductor chip by an anisotropic second etching.

27. The method of claim 22, further comprising forming a source region and a drain region of a second conductivity type in the semiconductor chip, at least one of the source region and drain region being adjacent to the trench gate and extending into the semiconductor chip from the main surface to a region depth less than the gate depth.

28. The method of claim 27, wherein forming the trench includes:
   forming an initial trench extending into the semiconductor chip from the main surface to a protection depth less than the gate depth; and
   after forming the upper trench insulation region in the initial trench, extending the initial trench to the gate depth by etching an area of the semiconductor chip below the initial trench, wherein the protection depth is less than the region depth.

29. The method according to claim 27 wherein forming the source region and the drain region includes:
   forming source and drain contact regions extending from the main surface at a non-zero distance from the trench gate; and
   forming source and drain internal regions, said source and drain internal regions having a first dopant concentration and said contact regions having second dopant concentration higher than the first dopant concentration.

30. A method for manufacturing a vertical-gate MOS transistor integrated in a semiconductor chip of a first conductivity type, said semiconductor chip having a main surface, the method comprising:
   forming a trench gate extending into the semiconductor chip from the main surface to a gate depth, said step of forming the trench gate including the steps of forming a control gate and forming an insulation layer for insulating the control gate from the semiconductor chip, wherein the step of forming the insulation layer includes:
   forming a trench extending into the semiconductor chip from the main surface to a protection depth less than the gate depth, the trench having a lateral wall and a bottom wall;
   forming a first auxiliary insulation layer in the trench;
   removing a bottom wall of the first auxiliary insulation layer in correspondence with the bottom wall of the trench;
   extending the trench to the gate depth; and
   forming a second auxiliary insulation layer in the trench, wherein forming the trench includes forming an edge portion of the lateral wall of the trench, the edge portion extending from the main surface and being inclined outwardly with respect to a remaining portion of the lateral wall of the trench.

31. The method of claim 30, wherein the first auxiliary insulation layer has a first thickness and the second auxiliary insulation layer has a second thickness, the second thickness being in a range from 18% to 66% of the first thickness.

32. The method of claim 30, wherein forming the trench includes:
   selectively etching the semiconductor chip by an isotropic first etching to form the edge portion; and
   selectively etching the semiconductor chip by an anisotropic second etching.

33. The method of claim 30, further comprising forming a source region and a drain region of a second conductivity type in the semiconductor chip, at least one of the source region and drain region being adjacent to the trench gate and extending into the semiconductor chip from the main surface to a region depth less than the gate depth.

34. The method of claim 33, wherein the protection depth is less than the region depth.

35. The method according to claim 33 wherein forming the source region and the drain region includes:
   forming source and drain contact regions extending from the main surface at a non-zero distance from the trench gate; and
   forming source and drain internal regions, said source and drain internal regions having a first dopant concentration and said contact regions having second dopant concentration higher than the first dopant concentration.

* * * * *